(12) United States Patent
Chen et al.

(10) Patent No.: US 12,489,064 B2
(45) Date of Patent: Dec. 2, 2025

(54) METHOD FOR FORMING MARK, PACKAGING METHOD OF SEMICONDUCTOR DEVICE, AND SEMICONDUCTOR DEVICE HAVING THE MARK

(71) Applicant: Taiwan Semiconductor Manufacturing Company, Ltd., Hsinchu (TW)

(72) Inventors: Shih-Wei Chen, Hsinchu (TW); Po-Yuan Teng, Hsinchu (TW); Chiahung Liu, Hsinchu (TW); Hao-Yi Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 524 days.

(21) Appl. No.: 18/099,715

(22) Filed: Jan. 20, 2023

(65) Prior Publication Data

US 2024/0178152 A1    May 30, 2024

Related U.S. Application Data

(60) Provisional application No. 63/428,907, filed on Nov. 30, 2022.

(51) Int. Cl.
*H01L 21/00* (2006.01)
*H01L 21/56* (2006.01)
*H01L 23/31* (2006.01)
*H01L 23/48* (2006.01)
*H01L 23/544* (2006.01)
*H10B 80/00* (2023.01)

(52) U.S. Cl.
CPC ............ *H01L 23/544* (2013.01); *H01L 21/56* (2013.01); *H01L 23/3128* (2013.01); *H10B 80/00* (2023.02); *H01L 2223/54406* (2013.01); *H01L 2223/54413* (2013.01); *H01L 2223/5442* (2013.01); *H01L 2223/54433* (2013.01)

(58) Field of Classification Search
None
See application file for complete search history.

(56) References Cited

U.S. PATENT DOCUMENTS

| 5,669,995 A * | 9/1997 | Hong ............... G11B 7/127 |
| 6,168,207 B1 * | 1/2001 | Nishizawa ......... G11B 7/26 |
| 2002/0036235 A1 * | 3/2002 | Kudo ............... G06K 1/126 |
| | | 257/E23.179 |

(Continued)

*Primary Examiner* — Nicholas J Tobergte
(74) *Attorney, Agent, or Firm* — Birch, Stewart, Kolasch & Birch, LLP

(57) ABSTRACT

The present disclosure relates to a method for forming a mark, a packaging method for a semiconductor device, and a semiconductor device having the mark, wherein the marking material is a polymer compound and the light transmittance of the marking material is less than 50%, which is suitable for forming the mark on the semiconductor device by laser sintering, and the marking material is sintered to make the resin cross-link and cure to form a cured product. In addition, in one embodiment, the cured product formed by the marking material can be used as a deflector to guide the flow of the underfill and control the flow rate of underfill, so as to effectively solve the problem of uneven flow rate of the underfill.

20 Claims, 6 Drawing Sheets

(56) References Cited

U.S. PATENT DOCUMENTS

| | | | |
|---|---|---|---|
| 2011/0219964 A1* | 9/2011 | Chen | B44C 3/082 101/32 |
| 2014/0017822 A1* | 1/2014 | Sakai | H01L 21/6836 438/15 |
| 2016/0264792 A1* | 9/2016 | Jauzein | C09K 19/02 |

* cited by examiner

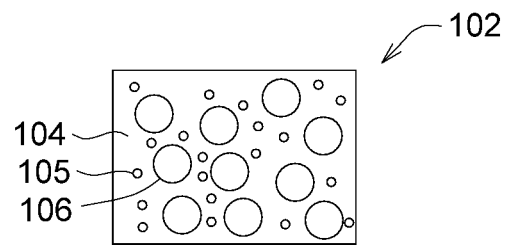
FIG. 2A
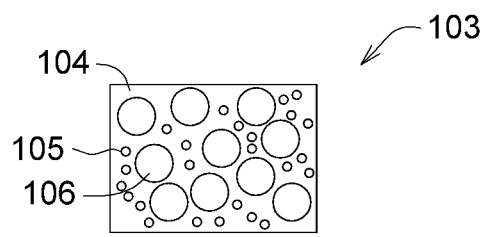
FIG. 2B
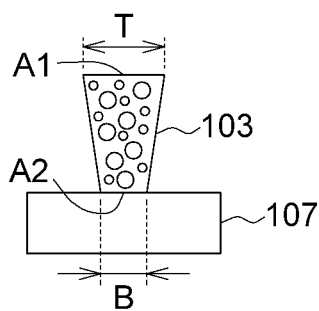 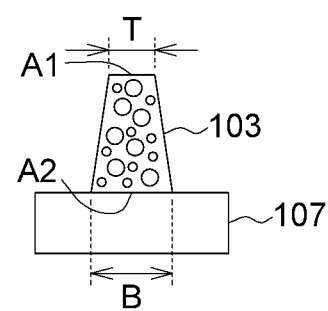
FIG. 2C　　　FIG. 2D

US 12,489,064 B2

METHOD FOR FORMING MARK, PACKAGING METHOD OF SEMICONDUCTOR DEVICE, AND SEMICONDUCTOR DEVICE HAVING THE MARK

PRIORITY CLAIM AND CROSS-REFERENCE

This application claims the benefit of U.S. provisional application Ser. No. 63/428,907, filed Nov. 30, 2022, the subject matter of which is incorporated herein by reference.

BACKGROUND

The laser can be used for marking applications, such as texts, images, logos, etc. Due to the very high power density of the laser radiation, local vaporization or melt expulsion of the marking material occurs. The depression depth of the mark can be controlled via laser processing parameters.

For forming a mark on the semiconductor device, outmost PM layer was placed by black PM layer and the laser radiation is absorbed by the black PM layer to create characters or two-dimensional barcode, so that the production information related to the semiconductor device can be immediately obtained through the two-dimensional barcode. However, it causes the challenges for packages without specific marking layer existed on the package, and it needs to use new material which will not impact whole semiconductor process, durable for longer thermal budget and further severe reliability test.

BRIEF DESCRIPTION OF THE DRAWINGS

FIG. 2A is a schematic view of the state before the marking material is not sintered.

FIG. 2B is a schematic diagram of the marking material sintered into a cured product.

FIGS. 2C and 2D are schematic cross-sectional views of two cured products.

DETAILED DESCRIPTION

Figure 1A:
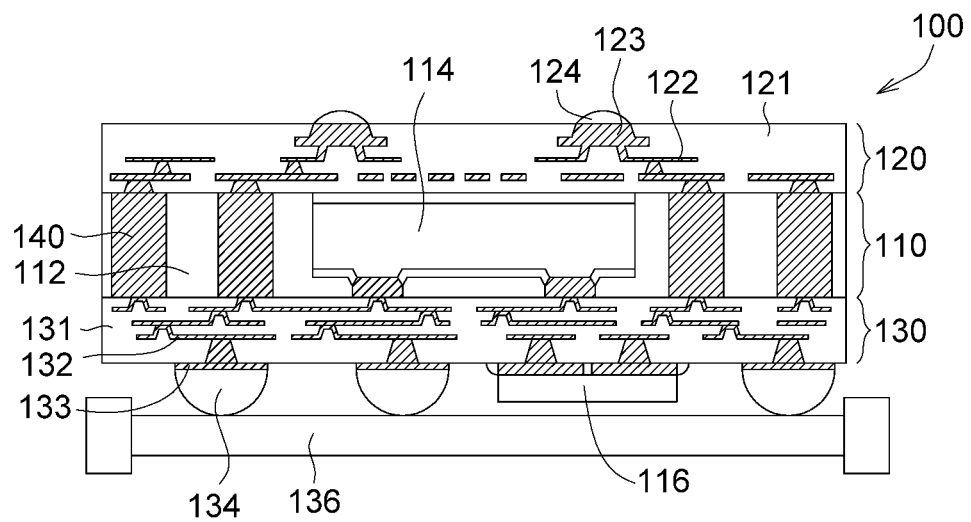
FIGS. 1A to 1D are schematic diagrams illustrating a method for forming a mark according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
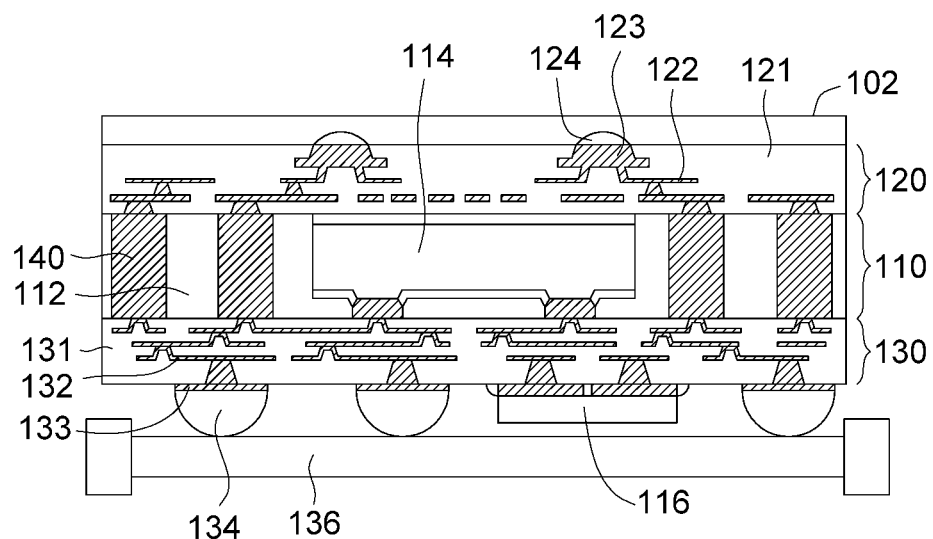
Figure 1C:
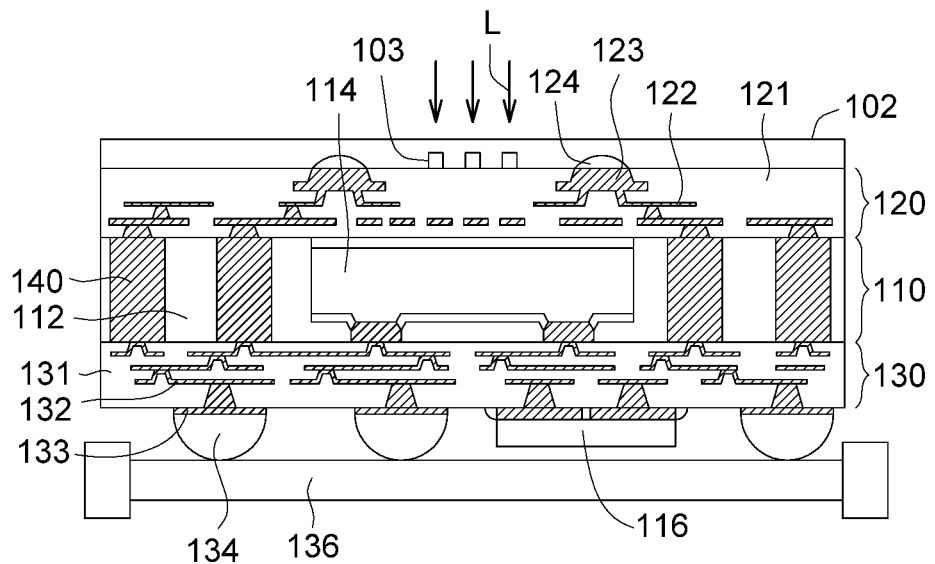
Figure 1D:
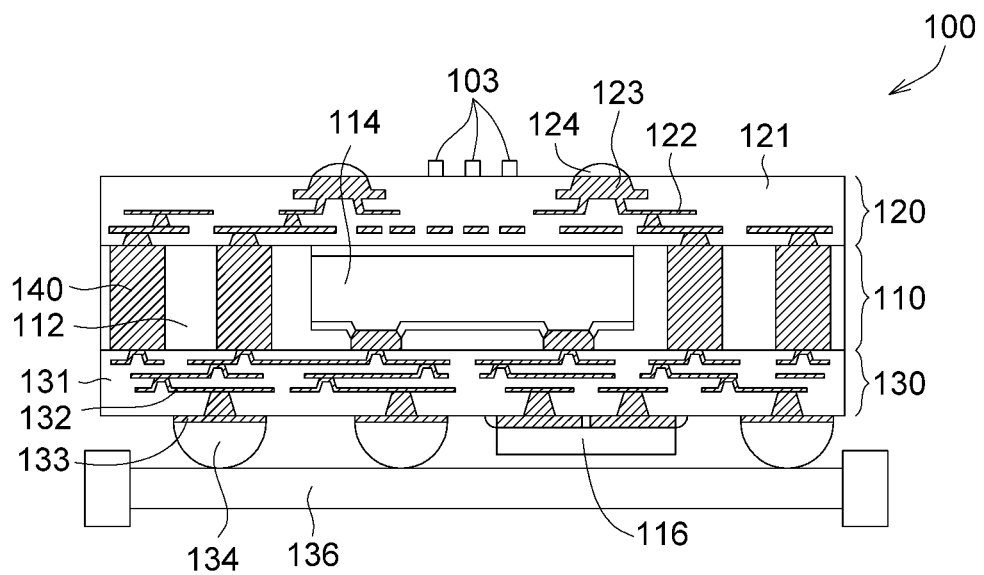

Please refer to FIGS. 1A to 1D, which are schematic diagrams illustrating a method for forming a mark according to an embodiment of the present disclosure. The method for forming a mark includes the following steps. First, in FIG. 1A, a semiconductor device 100 is provided, and the semiconductor device 100 has an interposer 110, a first redistribution structure 120, a second redistribution structure 130 and a through hole structure 140. The first redistribution structure 120 is located on a first side (e.g., upper side) of the interposer 110, and the second redistribution structure 130 is located on a second side (e.g., lower side) of the interposer 110. The first side is opposite the second side. The through hole structure 140 passes through the interposer 110 and connects with the first redistribution structure 120 and the second redistribution structure 130. In FIG. 1B, a marking material 102 is formed on the first redistribution structure 120, and the marking material 102 includes resin, curing agent, filler and solvent. In FIG. 1C, the marker material 102 is sintered by heat to bond and cure the resin. In FIG. 1D, a cured product 103 is formed to protrude from the first redistribution structure 120.

Please refer to FIG. 1A, the semiconductor device 100 is, for example, a system on integrated chip (SoIC), wherein the interposer 110 includes, for example, an epoxy molding compound (EMC) 112, and the EMC 112 includes a compound containing epoxy resin, and the epoxy-containing compound can be hardened (i.e., cured) to provide the function of a dielectric material with sufficient hardness and mechanical strength. EMC 112 may include epoxy resins, curing agents, silica (as filler material) and other additives. EMC 112 can be available in liquid form or solid form depending on viscosity and fluidity. Liquid EMC 112 generally provides better handling, good fluidity, fewer voids, better filling and fewer flow marks. Solid EMC 112 generally provides less cure shrinkage, better stand-off, and less die drift. High filler content in EMC 112 (e.g., 85% by weight) reduces molding time, molding shrinkage, and molding warpage. Uniform filler size distribution in EMC 112 can reduce flow marks and enhances flow. The curing temperature of EMC 112 can be lower than the release (peel) temperature of the die attach film (DAF). For example, the curing temperature of EMC 112 may be in the range of 125° C. to 150° C. The EMC 112 may be cured at a curing temperature to form an EMC matrix that laterally surrounds each of the bridge dies 114 and the through hole structures 140.

The first redistribution structure 120 may include a first redistribution dielectric layer 121, a first redistribution wiring interconnect 122 and a first bonding pad 123. The first redistribution dielectric layer 121 includes a dielectric polymer material, such as polyimide (PI), benzocyclobutene (BCB) or polybenzobisoxazole (PBO). Each of the first redistribution dielectric layers 121 may be formed by spin coating and drying the dielectric polymer material. The thickness of each first redistribution dielectric layer 121 may be in the range of 2 microns to 40 microns (e.g., 4 microns to 20 microns). The photoresist layer can be applied over each first redistribution dielectric layer 121 and patterned using an etching process (e.g., anisotropic etching process) to transfer the pattern in the photoresist layer into the first redistribution dielectric layer 121. Subsequently, the photoresist layer can be removed by ashing, for example. Additionally, the metal fill material for the first redistribution wiring interconnects 122 may include copper, nickel, or both copper and nickel. The thickness of the metal fill material deposited to form each of first redistribution wiring interconnects 122 may be in the range of 2 microns to 40 microns (e.g., 4 microns to 10 microns), but smaller or greater thicknesses may also be used. The total number of wiring levels in the first redistribution structure 120 may range from 1 to 10.

The first bonding pads 123 may have a rectangular, rounded rectangular or circular horizontal cross-sectional shape, and the thickness of the first bonding pads 123 may be in the range of 5 microns to 50 microns. Additionally, the first bond pads 123 may be configured for micro-bump (e.g., copper pillar) bonding, and may have a thickness in the range of 30 microns to 100 microns. In addition, conductive bumps 124 are formed on the first bonding pads 123 and may be ball grid array (BGA) connectors, solder balls, metal pillars, controlled collapse chip connections (C4) bumps, micro-bumps, bumps formed by electroless nickel-electroless palladium-immersion gold (ENEPIG) technology, or the like.

The through hole structure 140 is, for example, a combination of a metal nitride liner material (e.g., TiN, TaN, WN, or a combination thereof) and a metal filler material (e.g., W, Mo, Co, Ru, Cu, or any other transition metal). The through hole structure 140 is, for example, a through-integrated-fan-out via (TIV) structure, which is a conductive via structure extending vertically through a fan-out silicon interposer.

The system on integrated chips (SoIC) packaging technology adopted by the semiconductor device 100 of the present embodiment is based on wafer-on-wafer (WoW) and chip-on-wafer (CoW) multi-chip stacking technologies, the dies are stacked in a face-to-face or face-to-back manner, and through silicon via (TSV) technology and micro-bumps are used to connect multiple semiconductor dies to each other.

As shown in FIG. 1A, at least one semiconductor die 116 is attached to the second redistribution structure 130, and can be electrically connected to the bridge die 114 in the die bonding area through the second redistribution structure 130. The semiconductor die 116 and the bridge die 114 may be a central processing unit (CPU) die, a graphics processing unit (GPU) die, a system-on-a-chip (SoC) unit die or a high bandwidth memory (HBM), a power management die (for example, power management integrated circuit (PMIC), a radio frequency (RF) die, a sensor die, a micro-electromechanical-system (MEMS) die, a signal processing die (such as digital signal processor, DSP) etc., the present disclosure is not limited thereto.

The structure and manufacturing method of the second redistribution structure 130 are similar to that of the first redistribution structure 120, which has been illustrated in the above disclosure. The second redistribution structure 130 may include a second redistribution dielectric layer 131, a second redistribution wiring interconnect 132 and a second bonding pad 133. The second redistribution dielectric layer 131 includes a dielectric polymer material, such as polyimide (PI), benzocyclobutene (BCB), or polybenzobisoxazole (PBO). The thickness of each second redistribution dielectric layer 131 may be in the range of 2 microns to 40 microns (e.g., 4 microns to 20 microns). The metal fill material for the second redistribution wiring interconnect 132 may include copper, nickel, or both copper and nickel. The metal fill material for the second bond pads 133 may include copper. The soldering materials 134 (e.g., solder balls) can be formed on the second bonding pads 133, and the semiconductor device 100 and a carrier 136 (e.g., a silicon substrate or a glass epoxy-based circuit board, etc.) are electrically connected to each other through the soldering materials 134.

Additionally, at least one underfill material (not shown) is formed around each joined array of solder materials 134, such as by injecting underfill around the array of solder materials 134 after reflowing the solder materials 134, to protect the semiconductor die 116 and the solder materials 134.

In FIGS. 1B and 2A, the marking material 102 is formed on the first redistribution structure 120. The marking material 102 includes resin 104, a curing agent 105, fillers 106, solvent, and the like. The resin 104 is, for example, a thermosetting resin such as epoxy resin, and can form a thermosetting resin having a three-dimensional network structure under the action of appropriate curing agent 105 and heating conditions. The fillers 106 can increase the solvent resistance and heat resistance of the resin 104, and the solvent can reduce the viscosity of the resin 104 and increase the fluidity of the resin 104 during processing. The marking material 102 is formed on the first redistribution structure 120 by, for example, printing, spin coating, etc., in a viscous state, and its thickness is about 5 microns to 100 microns.

In FIG. 1C, the laser L is used to locally heat the marking material 102. After the marking material 102 absorbs the energy of the laser L, the heat energy can help the solvent to volatilize and cause the resin 104 to be cross-linked and shrink. Since the temperature of the resin 104 after absorbing the energy of the laser L may be higher than 200 degrees, for example, 250 degrees, the resin 104 is rapidly heated to cross-link and solidify and wrap around the fillers 106, so that a part of the marking material 102 is sintered into a cured product 103, and the remaining unsintered marking material 102 remain in an original uncured state.

In FIG. 1D, the remaining unsintered marking material 102 can be removed after being cleaned by a scrubber, leaving only the cured product 103 protruding from the first redistribution structure 120. In some embodiments, the cured product 103 can be a text, a symbol, a logo or a two-dimensional bar code, which is used to indicate the model, name, production serial number/batch and production history of the semiconductor device 100 to facilitate production process management. Since the cured product 103 is formed after the manufacturing process of the semiconductor device 100 has been completed, the marking material 102 for forming the cured product 103 does not need to use a special chemical resistant material, nor does it need to undergo the front-end, the middle-end and back-end processes of the semiconductor device 100, so as to avoid damage to the marking material 102 caused by chemical processing processes such as thermal process, etching process or deposition process.

As shown in FIGS. 2A to 2D, FIG. 2A is a schematic diagram of the state before the marking material 102 is sintered, FIG. 2B is a schematic diagram of the marking material 102 sintered into a cured product 103, and FIGS. 2C and 2D are two schematic cross-sectional views of the cured products 103. In FIG. 2A, components such as the resin 104, the curing agent 105, the fillers 106 and the solvent etc. are evenly distributed in the liquid marking material 102 before being heated. In FIG. 2B, the volume of the marking material 102 is reduced after being heated, and the resin 104, the curing agent 105 and the fillers 106 are aggregated and shrunk to form a cured product 103. The height of the cured product 103 is about 5 micros to 100 micros, and the light transmittance is less than 50% or lower. For example, dark pigments or light absorbing materials are added to the marking material 102 to prevent the laser from passing through the marking material 102 and the energy of laser can be absorbed. Since the material shrinkage rate of the marking material 102 is different and the laser energy distribution is different, and the shrinkage size is affected by the thermal expansion coefficient of the contact medium 107 under the cured product 103, the cured product 103 can be a cylinder with a wide top and a narrow bottom or a narrow top and a wide bottom. The critical dimension (T) of the top surface A1 is different from the critical dimension (B) of the bottom surface A2. The difference between the critical dimension (T) of the top surface A1 and the critical dimension (B) of the bottom surface A2 can be in the range from 5% to 50% of the critical dimension (B) of the bottom surface A2.

Figure 3A:
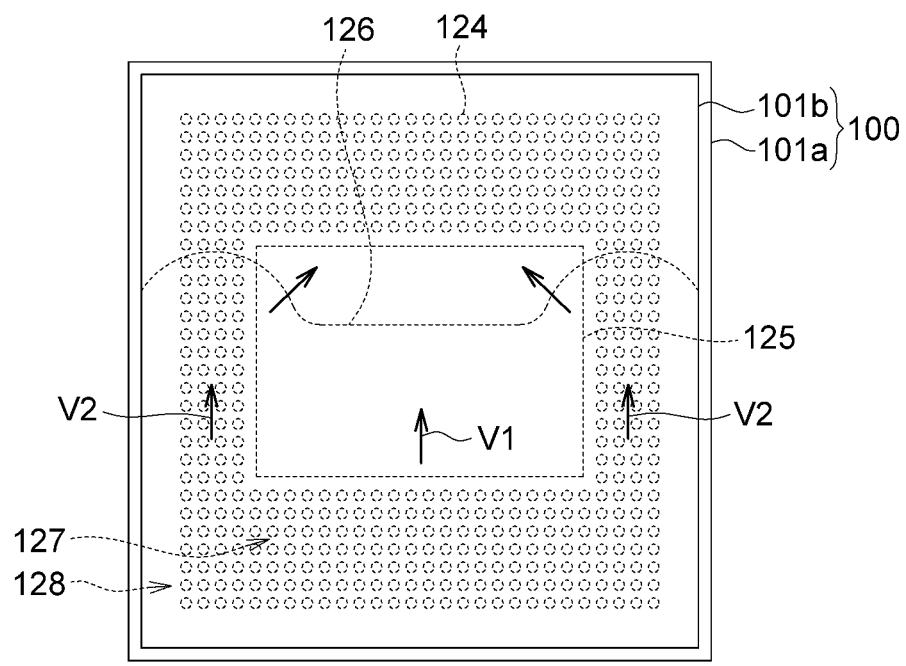
FIGS. 3A and 3B are schematic diagrams of a packaging method of a semiconductor device according to a comparative example and an embodiment, respectively.
Figure 3B:
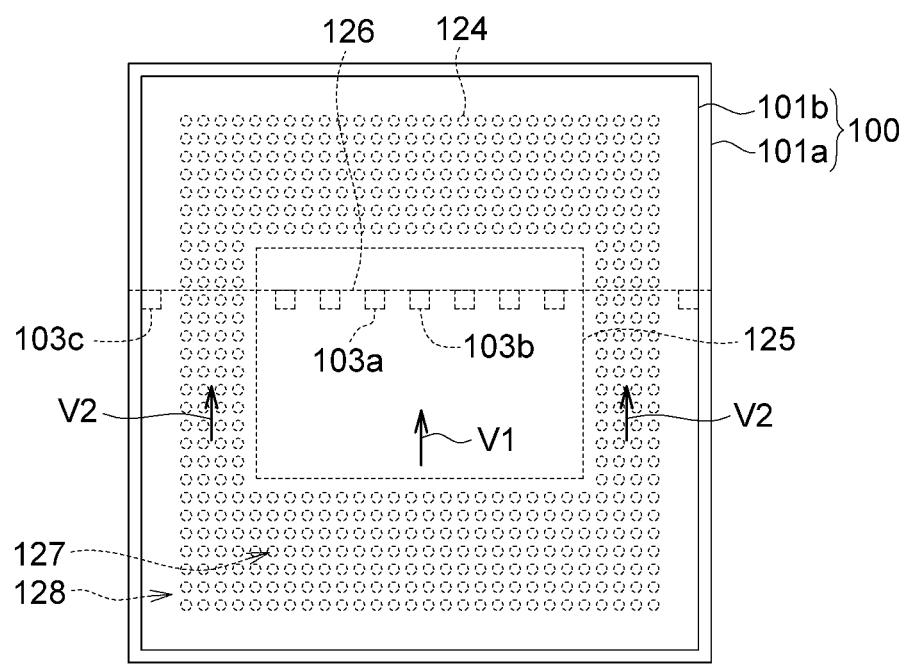

Please refer to FIGS. 3A to 3B, which are schematic top views of a packaging method of a semiconductor device 100 according to a comparative example and an embodiment, respectively. In FIG. 3A, from a plan view, the semiconductor device 100 includes a first semiconductor device 101a and a second semiconductor device 101b, the second semiconductor device 101b is disposed on the first semiconductor device 101a, and the size of the second semiconductor device 101b is slightly smaller than the size of the first semiconductor device 101a. There are a plurality of conductive bumps 124 between the first semiconductor device 101a and the second semiconductor device 101b, wherein the conductive bumps 124, i.e., an array of bumps, are located corresponding to a surrounding area 127, so that the middle area 125 is not provided with the conductive bumps 124. When a underfill 126 is injected between the first semiconductor device 101a and the second semiconductor device 101b, under the influence of the adhesion (capillary phenomenon) between the conductive bumps 124 and the underfill 126, the underfill flow rate V2 in the surrounding area 127 is accelerated, so that the underfill flow rate V1 in the middle area 125 is lower than the underfill flow rate V2 in the surrounding area 127. The faster underfill 126 moves to the middle area 125 from the surrounding area 127 at both sides of the semiconductor device 100, so that a part of the air is encapsulated in the underfill 126 to form bubbles or voids. In order to avoid the above situation, in present embodiment, a packaging method for a semiconductor device 100 that effectively solves the uneven flow rate of the underfill is provided.

Please refer to FIG. 3B, first, a first semiconductor device 101a and a second semiconductor device 101b are provided, the second semiconductor device 101b is disposed on the top of the first semiconductor device 101a, a plurality of conductive bumps 124 and at least one deflector 103a-103c are disposed between the first semiconductor device 101a and the second semiconductor devices 101b. Next, an underfill 126 is injected between the first semiconductor device 101a and the second semiconductor device 101b, and the underfill 126 covers the conductive bumps 124 and the at least one deflector 103a-103c. The deflectors 103a-103c are formed, for example, in the middle area 125 surrounded by the conductive bumps 124 arranged in a rectangular shape or in an outer blank area 128 outside the conductive bumps 124. The deflectors 103a-103c can be in any shape, such as circular, elongated, L-shaped, and the like. Since the fluidity of the underfill 126 is affected by the adhesion of the deflectors 103a-103c, the flow rate V1 of the underfill 126 in the middle area 125 and the outer blank area 128 will be increased, so that the flow rates of the underfill 126 can be uniform in middle area 125 and the surrounding area 127, so as to prevent a part of the air from being trapped in the underfill 126.

Figure 3C:
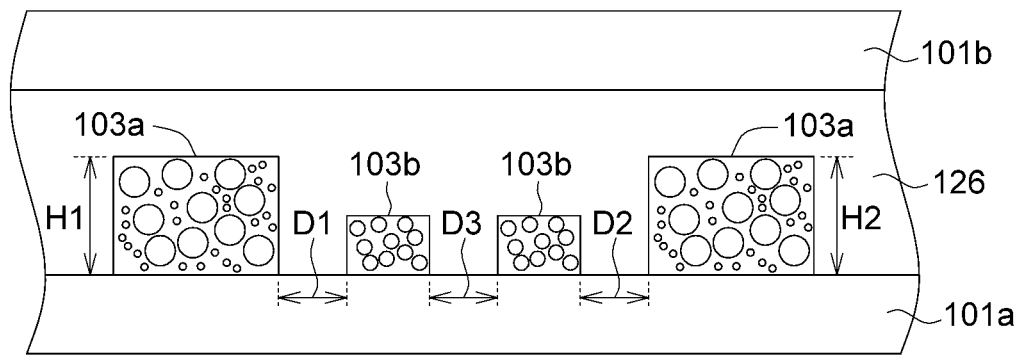
FIG. 3C is a schematic vertical cross-sectional view of a deflector for guiding the underfill in FIG. 3B.

Please refer to FIG. 3C, which illustrating a schematic vertical cross-sectional view of the deflectors 103a-103b for guiding the underfill in FIG. 3B. As shown in the method for forming a mark of FIGS. 2A to 2D, the deflectors 103a-103c may be composed of a marking material 102, the marking material 102 includes a resin, a curing agent, fillers and solvent etc., and the marking material 102 is sintered to make the resin cross-link and cure to form a cured product 103 protruding from the first semiconductor device 100. The heights H1 and H2 of the deflectors 103a-103b can be determined according to the positions of the deflectors 103a-103b or the required flow rate of the underfill 126, and the widths DI to D3 of the two adjacent deflectors 103a-103b can be determined according to the flow rate and pressure of the underfill 126 passing through the gaps between two adjacent deflectors 103a-103b. When the flow rate of the underfill 126 increases, the pressure of flow decreases; conversely, when the flow rate of the underfill 126 decreases, the pressure of flow increases. For example, the height of the deflectors 103a closest to the two sides of the middle area 125 are the highest, and the height of the deflectors 103b near the center of the middle area 125 are the lowest. Alternatively, the height of the deflectors 103b near the center of the middle region 125 are the highest, and the height of the deflectors 103a closest to the two sides of the middle region 125 are the lowest. Alternatively, the width between the adjacent deflectors 103b located near the center of the middle area 125 is the widest, and the width between the adjacent deflectors 103a-103b closer to the two sides of the middle area 125 is narrower.

Figure 4:
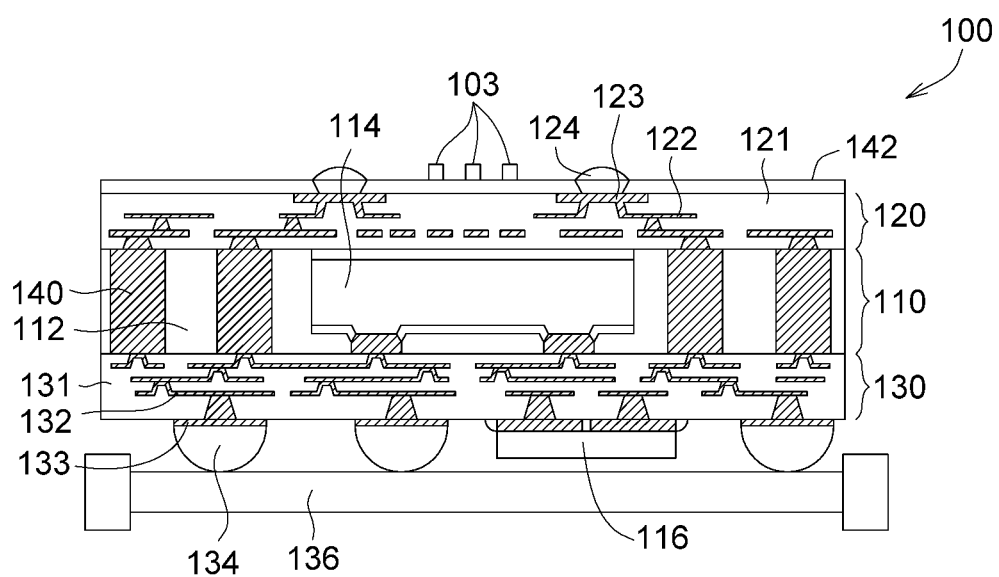
FIG. 4 is a schematic diagram of a semiconductor device according to another embodiment of the present disclosure.

Please refer to FIG. 4, which is a schematic diagram of a semiconductor device 100 according to another embodiment of the present disclosure. The semiconductor device 100 of this embodiment is substantially the same as the above-mentioned embodiment, the difference is that the semiconductor device 100 further includes a backside enhance layer 142 formed on the backside of the semiconductor device 100 (i.e., formed on the first redistribution structure 120), the backside enhance layer 142 is a polymer compound, which includes resin, curing agent, catalyst, fillers, and additives etc. The resin can be an epoxy-containing compound that can be hardened (i.e., cured) to provide a dielectric material with sufficient hardness and mechanical strength. In one embodiment, the backside enhance layer 142 can be selected from the same or similar polymer compound as the EMC 112 of the interposer 110 and the marking material 102.

In addition, the cured product 103 formed by the marking material 102 is disposed on the backside enhance layer 142, the cured product 103 protrudes from the backside enhance layer 142, and the position of the cured product 103 can overlap with the die attaching region where the bridge die 114 is located in the vertical direction. In another embodiment, the position of the cured product 103 may overlap with the fan-out area where the through hole structure 140 is located in the vertical direction, which is not limited in the present disclosure.

Figure 5A:
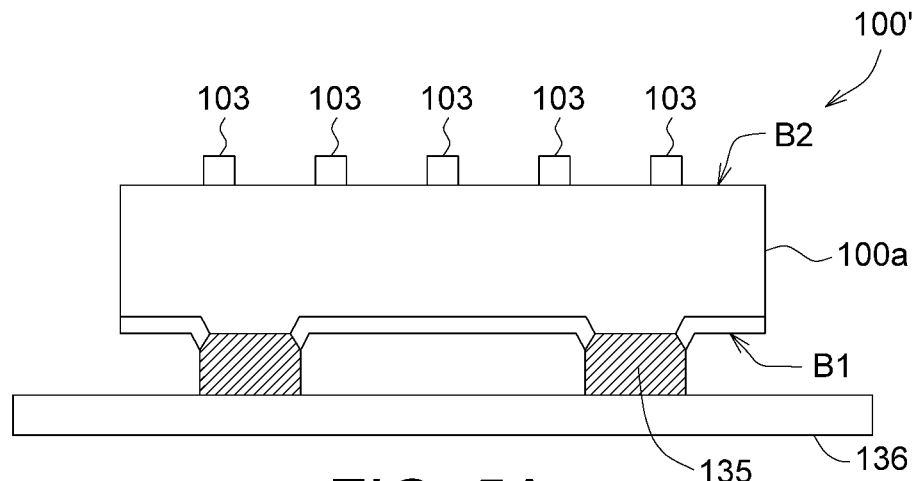
FIGS. 5A and 5B are schematic diagrams of a semiconductor device according to another two embodiments of the present disclosure, respectively.
Figure 5B:
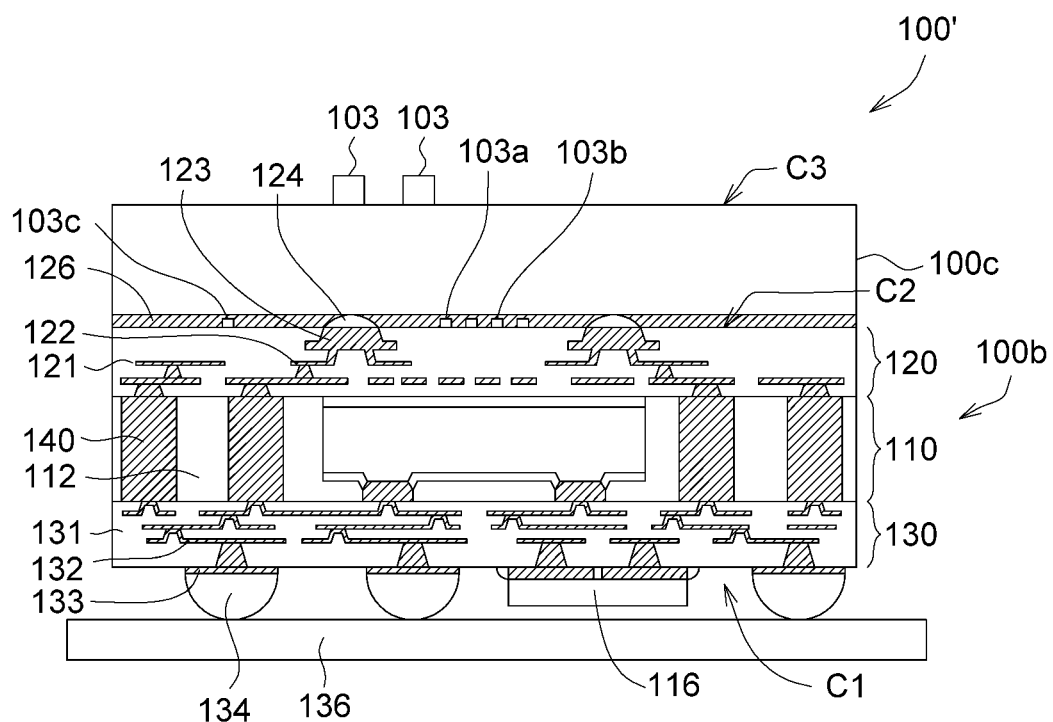

In addition, please refer to FIGS. 5A and 5B, which are schematic diagrams of the semiconductor device 100' according to another two embodiments of the present disclosure, respectively. In FIG. 5A, the semiconductor device 100' includes an integrated circuit chip 100a and a cured product 103. The integrated circuit chip 100a may include a central processing unit (CPU) die, a graphics processing unit (GPU) die, a system-on-a-chip (SoC) unit die, a high bandwidth memory (HBM), a power management die (i.e., PMIC), a radio frequency (RF) die, a sensor die, a microelectromechanical system (MEMS) die, a signal processing die (i.e., DSP), or a combination thereof. The integrated circuit chip 100a has a package side B1 and a back side B2, there are a plurality of conductive bumps 135 on the package side B1 for mounting on the carrier 136, and the cured product 103 can be composed of a marking material 102, the marking material 102 includes resin, a curing agent, fillers and solvent and the marking material 102 is sintered to make the resin cross-link and cure to form the cured material 103 protruding from the backside B2 of the integrated circuit chip 100a.

In FIG. 5B, the semiconductor device 100' includes an integrated circuit chip 100b, a package element 100c, and a cured product 103. The integrated circuit chip 100b has a package side C1 and a back side C2, and the package side C1 and the back side C2 are respectively provided with a plurality of soldering materials 134 and a plurality of conductive bumps 124. The package element 100c is disposed on the integrated circuit chip 100b, and the package element 100c may be another integrated circuit chip. The package element 100c is disposed on the integrated circuit chip 100b in a flip-chip manner, such as NAND memory, NOR memory, or dynamic random access memory (DRAM), to complete a package on package (POP) stacking structure. The structure of the integrated circuit chip 100b is similar to that of the above-mentioned semiconductor device 100, and details are not repeated here.

The cured product 103 can be disposed on the back side C3 of the package element 100c, and the cured product 103 can be composed of a marking material 102, the marking material 102 includes a resin, a curing agent, fillers and a solvent. The marking material 102 is sintered to make the resin cross-link and cure to form the cured product 103 protruding from the backside C3 of the package element 100c.

In another embodiment, the cured products 103a or 103b may be disposed between the package element 100c and the integrated circuit chip 100b as a deflector (see FIG. 3C, 103a-103b), in the same manner as described in the above embodiment. Although the underfill is not shown in this embodiment, it is conceivable that there are a plurality of conductive bumps 124 between the integrated circuit chip 100b and the package element 100c, and the underfill 126 (refer to FIG. 3C, 126) can be injected into the gap between the package element 100c and the integrated circuit chip 100b to cover the conductive bumps 124. The cured products 103a and 103b are disposed in an area surrounded by the conductive bumps 124 or an outer area outside the area surrounded by the conductive bumps 124, so that the flow rate of the underfill 126 (refer to FIG. 3C, 126) can tend to be uniform.

The present disclosure relates to a method for forming a mark, a packaging method for a semiconductor device, and a semiconductor device having the mark, wherein the marking material is a polymer compound and the light transmittance of the marking material is less than 50%, which is suitable for forming the mark by laser sintering on the semiconductor device, and the marking material is sintered to make the resin cross-link and cure to form a cured product. In addition, in one embodiment, the cured product formed by the marking material can be used as a deflector to guide the flow of the underfill and control the flow rate of underfill, so as to effectively solve the problem of uneven flow rate of the underfill.

According to some embodiments of the present disclosure, a method for forming a mark is provided, which including the following steps: a semiconductor device is provided, which comprising an interposer, a first redistribution structure, a second redistribution structure, and a through hole structure. The first redistribution structure is located on a first side of the interposer, and the second redistribution structure is located on a second side of the interposer. The first side is opposite the second side. The through hole structure passes through the interposer and connects with the first redistribution structure and the second redistribution structure. A marking material is formed on the first redistribution structure, and the marking material includes resin, a curing agent, fillers and solvent. The marking material is sintered to make the resin cross-link and cure to form a cured product protruding from the first redistribution structure.

According to some embodiments of the present disclosure, a packaging method for a semiconductor device is provided, which including the following steps: a first semiconductor device and a second semiconductor device are provided, wherein the second semiconductor device is disposed on the first semiconductor device, a plurality of conductive bumps and at least one deflector are disposed between the first semiconductor device and the second semiconductor device. A underfill is injected between the first semiconductor device and the second semiconductor device, the underfill covers the conductive bumps and the at least one deflector, the deflector contains a marking material, the marking material includes resin, a curing agent, fillers and solvent, the marking material is sintered to make the resin cross-link and cure to form a cured product protruding from the first semiconductor device.

According to some embodiments of the present disclosure, a semiconductor device is provided, which includes an integrated circuit chip and a cured product, the integrated circuit chip has a package side and a back side, and a plurality of conductive bumps are arranged on the package side. The cured product is disposed on the integrated circuit chip, and the cured product is made from a marking material. The marking material includes resin, a curing agent, fillers and solvent. The marking material is sintered to make the resin cross-link and cure, so as to form the cured product protruding from the integrated circuit chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a mark, comprising:
providing a semiconductor device, wherein the semiconductor device comprises an interposer, a first redistribution structure, a second redistribution structure and a through hole structure, the first redistribution structure is located on a first side of the interposer, the second redistribution structure is located on a second side of the interposer, the first side is opposite to the second side, and the through hole structure passes through the interposer and connects with the first redistribution structure and the second redistribution structure;
forming a marking material on the first redistribution structure, the marking material comprising a resin, a curing agent, fillers and a solvent; and
sintering the marking material to make the resin cross-link and cure to form a cured product protruding from the first redistribution structure.

2. The method according to claim 1, further comprising removing a remaining part of the marking material that has not been sintered.

3. The method according to claim 2, wherein removing the remaining part of the marking material comprises cleaning the remaining part with a scrubber.

4. The method according to claim 1, wherein the cured product has a height of 5 to 100 microns.

5. The method according to claim 1, wherein a light transmittance of the cured product is less than 50%.

6. The method according to claim 1, wherein the cured product has a top surface and a bottom surface, and the top surface and the bottom surface have different sizes.

7. A packaging method for a semiconductor device, comprising:
providing a first semiconductor device and a second semiconductor device, wherein the second semiconductor device is disposed over the first semiconductor device, and a plurality of conductive bumps and at least one deflector are disposed between the first semiconductor device and the second semiconductor device; and
injecting an underfill between the first semiconductor device and the second semiconductor device, and the underfill covers the conductive bumps and the at least one deflector,
wherein the at least one deflector contains a marking material, the marking material comprises a resin, a curing agent, fillers and a solvent, and the marking material is sintered to make the resin cross-link and cure to form a cured product protruding from the first semiconductor device.

8. The packaging method according to claim 7, wherein the at least one deflector is disposed in an area surrounded by the conductive bumps.

9. The packaging method according to claim 7, wherein the at least one deflector is disposed in an outer area outside an area surrounded by the conductive bumps.

10. The packaging method according to claim 7, wherein a shape of the at least one deflector is circular, elongated or L-shaped.

11. The packaging method according to claim 7, wherein a number of the at least one deflector is plurality, and the deflectors has a different height.

12. The packaging method according to claim 7, wherein a number of the at least one deflector is plurality, and widths between two adjacent deflectors are different.

13. A semiconductor device, comprising:
an integrated circuit chip having a package side and a back side opposite to the package side, and a plurality of soldering materials are provided on the package side; and
a cured product disposed on the integrated circuit chip, the cured product contains a marking material, the marking material comprises a resin, a curing agent, fillers and a solvent, and the marking material is sintered to make the resin cross-link and cure to form the cured product protruding from the integrated circuit chip.

14. The semiconductor device according to claim 13, further comprising a backside enhance layer, the backside enhance layer is disposed over the backside, and the backside enhance layer is a polymer compound containing epoxy resin.

15. The semiconductor device according to claim 14, wherein the cured product is a polymer compound containing epoxy resin, and is formed over the backside enhance layer.

16. The semiconductor device according to claim 13, further comprising a package element, the package element is disposed over the backside of the integrated circuit chip, and the cured product is disposed on the package element.

17. The semiconductor device according to claim 13, further comprising a package element, the package element is disposed on the backside of the integrated circuit chip, and the curing product is disposed between the package element and the integrated circuit chip.

18. The semiconductor device according to claim 13, wherein the semiconductor device further comprises an underfill, the underfill is injected between the package element and the integrated circuit chip.

19. The semiconductor device according to claim 18, wherein the curing product acts as a deflector for guiding a flow of the underfill.

20. The semiconductor device according to claim 13, further comprises a plurality of conductive bumps arranged between the semiconductor device and the package element, and the cured product is disposed in an area surrounded by the conductive bumps or an outer area outside the area surrounded by the conductive bumps.

* * * * *